United States Patent [19]

Szluk et al.

[11] Patent Number: 4,997,780
[45] Date of Patent: Mar. 5, 1991

[54] METHOD OF MAKING CMOS INTEGRATED DEVICES IN SEEDED ISLANDS

[75] Inventors: Nicholas J. Szluk; Jay T. Fukumoto, both of Albuquerque, N. Mex.

[73] Assignee: NCR Corporation, Dayton, Ohio

[21] Appl. No.: 248,265

[22] Filed: Sep. 21, 1988

[51] Int. Cl.[5] .......................................... H01L 21/477
[52] U.S. Cl. .......................................... 437/41; 437/56; 437/57; 437/62; 437/83; 437/173; 437/907; 148/DIG. 48; 148/DIG. 91
[58] Field of Search ............... 437/56, 57, 58, 62, 437/69, 84, 61, 83, 913, 915, 41, 34; 148/DIG. 85, DIG. 86

[56] References Cited

U.S. PATENT DOCUMENTS

| | | | |
|---|---|---|---|
| 4,444,620 | 4/1984 | Kovacs et al. | 437/83 |
| 4,463,492 | 8/1984 | Maeguchi | 437/41 |
| 4,500,388 | 2/1985 | Ohmura et al. | 148/DIG. 3 |
| 4,506,437 | 3/1985 | Godejahn, Jr. | 437/41 |
| 4,604,159 | 8/1986 | Kobayashi et al. | 437/84 |
| 4,654,958 | 4/1987 | Baerg et al. | 437/56 |
| 4,799,097 | 1/1989 | Szluk et al. | 357/42 |
| 4,933,298 | 12/1988 | Husegawa | 437/62 |

Primary Examiner—Brian E. Hearn
Assistant Examiner—Gordon V. Hugo
Attorney, Agent, or Firm—Wilbert Hawk, Jr.; Casimer K. Salys

[57] ABSTRACT

The structure of a pair of concentrically disposed field effect transistors responsive to a common gate electrode, and a process for the fabrication thereof. In one form, a dielectric region is surrounded by an active region of monocrystalline silicon and has situated upon the dielectric region a layer of recrystallized silicon as a second active region. A gate electrode overlies both active regions and serves as a mask to form in such respective regions self-aligned channels. The concentric placement of the active substrate monocrystalline silicon region, and inner perimeter of dielectric, and a further inner active region of recrystallized silicon situated over a dielectric region, facilitates recrystallization from seed of monocrystalline silicon irrespective of the direction of translation taken by the energy beam, and associated melt, in scanning across the structure. The operational characteristics of the field effect transistor formed from recrystallized silicon are suitable for and readily interconnected as an element of a inverter/-buffer, with the field effect transistor formed in the surrounding substrate active region.

5 Claims, 5 Drawing Sheets

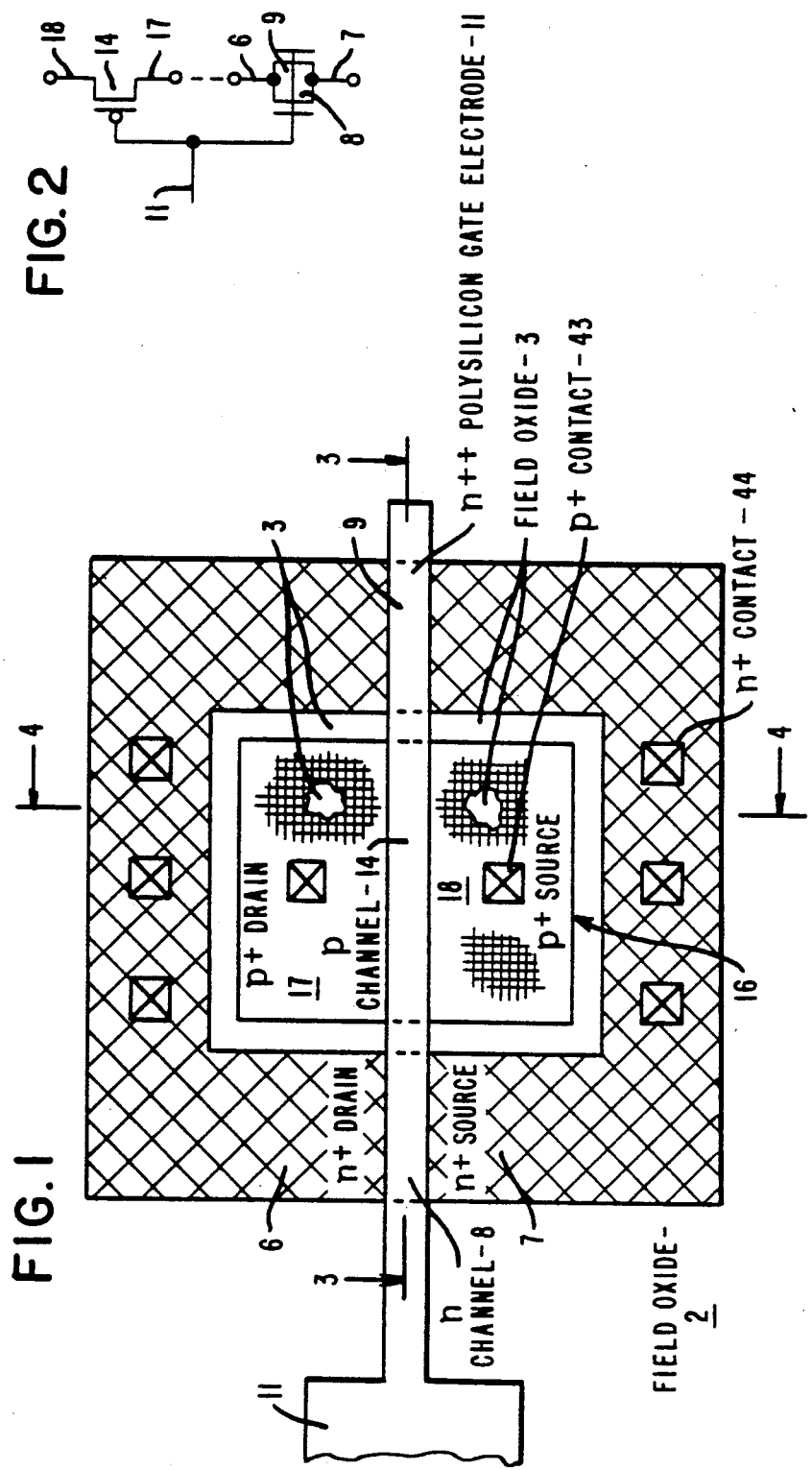

METHOD OF MAKING CMOS INTEGRATED DEVICES IN SEEDED ISLANDS

BRIEF SUMMARY

The present invention relates to the manufacturing of integrated circuits, and more particularly to the formation of monocrystalline silicon regions, situated over dielectric regions in a substrate, by employing seeded recrystallization.

In one aspect, the invention relates to a structural pattern for forming field effect transistors responsive to a common gate electrode. As preferably fabricated, the structure includes individual p-channel and n-channel devices which can be interconnected to form a standard inverter/buffer stage. The placement of one impurity type field effect transistor on a dielectric avoids the parasitic bipolar effect commonly encountered in CMOS structures, while by way of the recrystallization employed to form such placed field effect transistors, retaining the low leakage current characteristics of devices formed in monocrystalline silicon.

In another aspect, the invention involves a process for fabricating integrated circuit devices in which a monocrystalline silicon region suitable to form field effect transistors is formed on a dielectric region by seeded recrystallization from the substrate. The process is implemented with relatively few masks while creating both p-channel and n-channel field effect transistors on a common substrate. Recrystallization of a polycrystalline or amorphous silicon layer from seed regions of monocrystalline silicon substrate is consistently and efficiently implemented by defining a concentric pattern between the p-channel and n-channel field effect transistors, wherein the centrally located transistor is formed from recrystallized silicon situated on a dielectric which is itself enclosed within a boundary defined by the outer field effect transistor structure. The common gate electrode crosses the concentric regions to form a single channel in the recrystallized silicon field effect transistor and two parallel situated channels in the substrate based field effect transistor.

Fabrication begins by forming a dielectric region within an enclosing monocrystalline silicon substrate region, followed by a deposition of silicon, a recrystallization of the deposited silicon, a patterning etch to separate the recrystallized silicon over the dielectric region from the substrate silicon, the formation of a gate oxide layer, the formation of a patterned gate electrode layer, and individually masked n-type and p-type implants using the gate electrode as a self-aligning mask for the underlying channels.

A particularly important feature of the invention is the relative insensitivity of the preferred structure to the direction of the scan of any focused energy beam used during recrystallization. The concentric character of the functional pair of field effect transistors ensures that a scanned beam, most commonly a laser, always melts a region of polycrystalline or amorphous silicon directly over a monocrystalline silicon seed region, prior to melting the polycrystalline or amorphous silicon subject to seeded recrystallization and situated over the dielectric. Thereby, integrated circuit devices can be layed out without regard to the direction that the recrystallization beam will scan, and with a high degree of area efficiency for a p-channel and n-channel, CMOS, inverter/buffer transistors responsive to a common gate electrode.

These and other features of the invention will be more clearly understood upon considering the detailed description which follows.

DESCRIPTION OF THE DRAWINGS

FIG. 1 is a schematic representation of a representative layout for a CMOS field effect transistor pair according to the invention.

FIG. 2 is a electrical schematic illustrating the interconnection of two field effect devices in a preferred inverter/buffer configuration.

DETAILED DESCRIPTION

Figure 3:
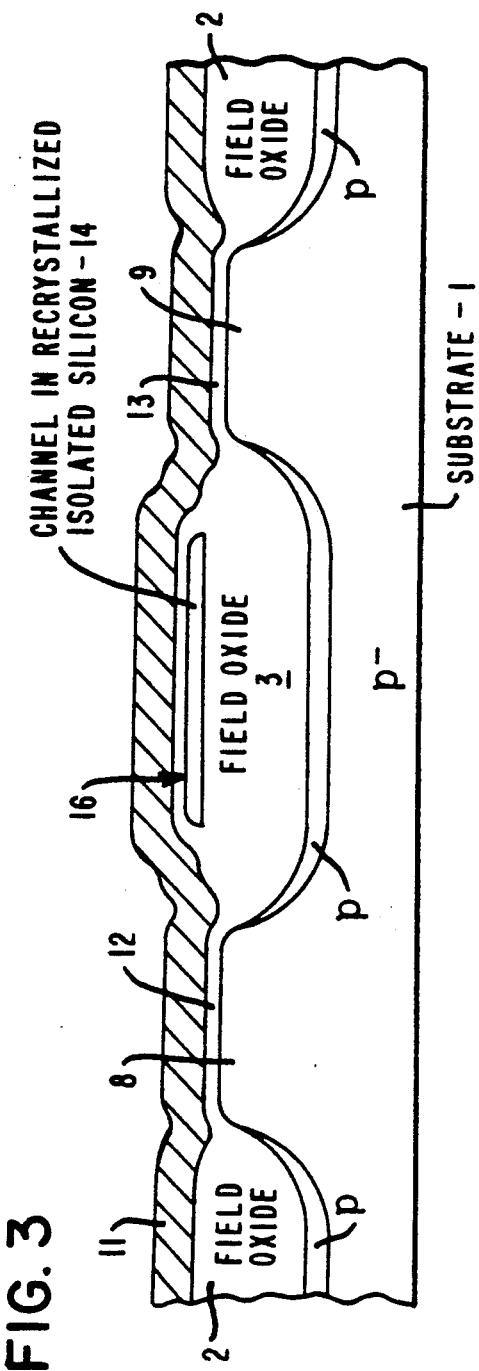
FIGS. 3 and 4 are schematic cross sections of the structure depicted by layout in FIG. 1.

The low power consumption of integrated circuits fabricated in CMOS has made such structures the norm for future designs. Unfortunately, the conventional use of wells or tubs to locate the transistors which have the same source/drain impurity type as a substrate introduces a susceptibility to latching, a phenomenon caused by parasitic bipolar transistors inherent in such composite structures. Although impurity gradients in substrates have mitigated the liklihood of latching by such parasitic bipolar devices, their catastrophic effects have not been completely eliminated.

Accordingly, new designs have sought to form selective field effect transistors in regions completely isolated by dielectric from the substrate silicon, while retaining the low leakage current and stable threshold voltage characteristics of field effect transistors formed in a monocrystalline silicon. In the pursue of such desirable objectives, significant recent work has involved the use of laser beam recrystallization to convert polycrystalline or amorphous silicon regions to monocrystalline form by initiating a melt of the polycrystalline or amorphous silicon at a seed point on a monocrystalline silicon substrate, and then extending that seed onto a dielectric region.

The fundamentals of this concept are described in U.S. Pat. No. 4,323,417. The effects of varying the shape of the initial polycrystalline or amorphous silicon structures and the beams are considered in U.S. Pat. No. 4,330,363, in a context where no seeding is used during the conversion to monocrystalline form. Further refinements in recrystallization from monocrystalline silicon seed regions are described in U.S. Pat. Nos. 4,592,799 and 4,599,133. The former relates to the orientation of seeding locations with respect to the scan direction of the laser beam as well as the shape of the beam, a central teaching being that the direction of movement of a beam be transversed to the elongated direction of the beam and the seed region pattern. The latter noted patent extends these concepts to multiple layers of silicon, individually isolated by the presence of dielectric layers in non-seed regions.

The present invention is distinctly directed to a specific implementation of a structure and related fabrication process suitable to create complementary pairs of integrated circuit field effect transistors with one transistor being of recrystallized form and residing on a dielectric layer. One embodiment of the invention is depicted schematically in FIG. 1, shown therein as a layout or top view. Corresponding sectional views along line 3—3 and 4—4 in FIG. 1 are respectively depicted in FIGS. 3 and 4 of the drawings. FIG. 2 illustrates a electrically equivalent circuit for the structure in FIG. 1 when connected to form an inverter/buffer.

Selective recrystallization from a seed region by laser heating is known to be sensitive to the scan direction of the laser beam, in that effective crystalline growth is highly localized to a solidifying region adjacent the beam's melt zone. Consequently, the layouts of the semiconductor devices subject to such recrystallization are commonly patterened and oriented in relation to the laser beam scan direction. The use of multiple scans in different directions on a single wafer remains economically unsound for volume manufacturing of semiconductor substrate wafers.

Unfortunately, the shape and dimensional restrictions imposed by alignments with the scan direction of the laser beam routinely do not produce dense layouts in integrated circuit chips. On the other hand, the failure to recrystallize polycrystalline or amorphous silicon regions results in the formation of field effect transistors which have high levels of leakage current and divergent or unstable threshold voltages characteristics. Furthermore, formerly utilized structural arrangements did not efficiently integrate in a single and unified configuration a single gate electrode and a complementary set of substrate and dielectrically based field effect transistors configured to operate as a CMOS inverter/buffer.

The layout depicted in FIG. 1 illustrates a unified configuration of two commonly gated field effect transistors. The layout is also arranged to make recrystallization substantially independent of the scan direction of the beam. Recrystallization always commences at a seed region in the monocrystalline silicon region and progresses onto the polycrystalline or amorphous silicon over dielectric regions, and in so doing creates over the dielectric recrystallize silicon regions suitable for the fabrication of high quality field effect transistors in complementary or other configurations.

Figure 4:
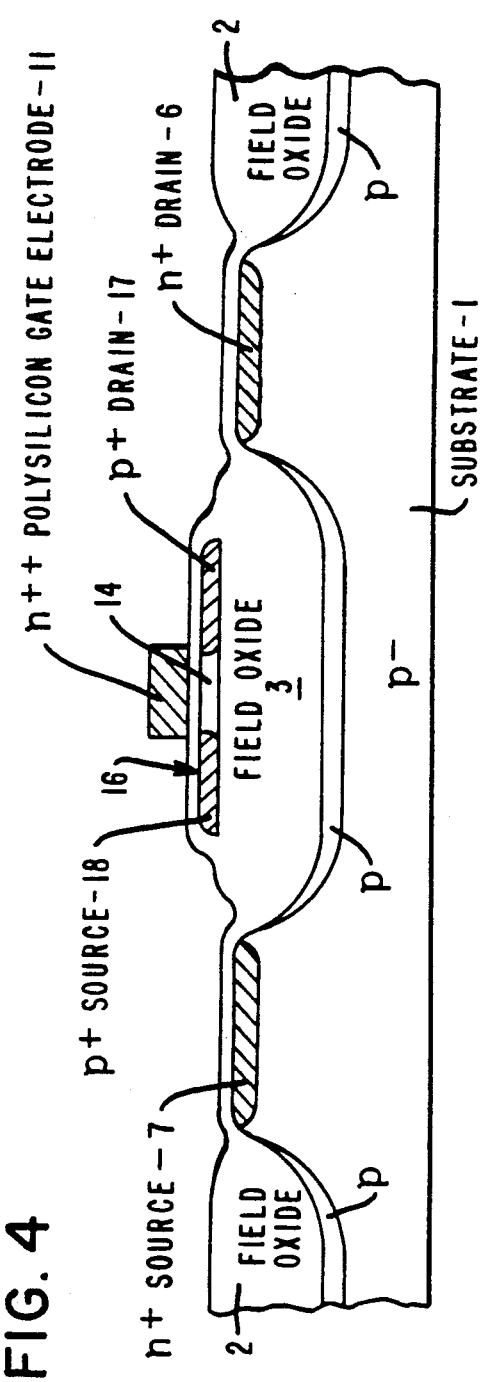
Figure 5:
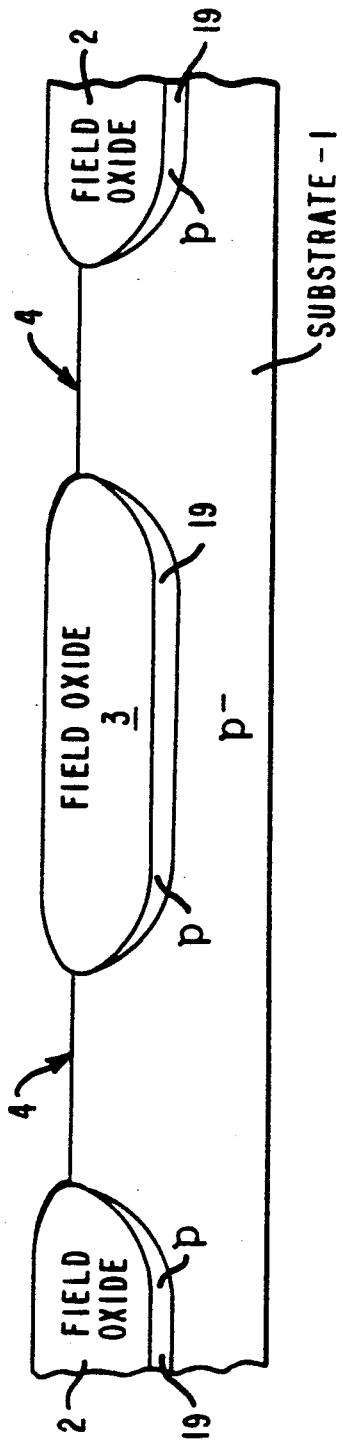
FIGS. 5-10 schematically illustrate in the cross section various stages in the course of fabricating the transistor pair structure shown by layout in FIG. 1 and by cross section in FIGS. 3 and 4.

The schematic configurations in FIGS. 1, 3 and 4 show a monocrystalline silicon substrate 1 of light p-type doping, having perimeter field oxide regions 2 and a centrally disposed field oxide region 3. Field oxide region 3 is surrounded by active regions formed in substrate 1, individually comprised of $n^+$ drain region 6, $n^+$ source region 7, and functionally parallel n-channel regions 8 and 9. Field effect transistor channel regions 8 and 9 are aligned and responsive to $n^{++}$ polysilicon gate electrode 11, which electrode 11 is isolated from the channel regions by respective gate dielectric layers 12 and 13, as shown in FIG. 3.

As further shown in FIGS. 1, 3 and 4, polysilicon gate electrode 11 also overlies a p-channel 14 formed in a layer 16 of recrystallized polycrystalline or amorphous silicon. Aligned to polysilicon gate electrode 11 and on respective opposite sides of p-channel 14 are $p^+$ drain region 17 and $p^+$ source region 18, all being monocrystalline in characters yet isolated by underlying dielectric field oxide 3 from substrate 1. The corresponding electrodes are identified in the inverter/buffer schematically shown in FIG. 2.

The structure depicted in FIG. 1 provides in addition to an efficient arrangement for an inverter/buffer, an arrangement which is particularly suitable for recrystallization using a scanned laser or other source of focused energy. The definition of an active region of seed monocrystalline silicon concentrically disposed about a field oxide region 3, with a compositely extending and overlying layer of polycrystalline or amorphous silicon, ensures that the melt of polycrystalline or amorphous silicon always proceeds from the monocrystalline seed region 4 to the recrystallized region 16 overlying the field oxide 3, thereby ensuring that the solidification of the silicon proceeds from the seed region to the isolated region. Note that with this structure, the seeding effect is substantially insensitive to the beam width and scanning direction, and that relatively good single crystal propagation can be anticipated from the seed region when the successive scan beams overlap, in that single cystal propagation will now be induced from more than one direction, namely both the side and the trailing edge of the beam path.

To more fully understand how the structure in FIG. 1 can be created, consider the representative fabrication sequence illustrated in FIGS. 5-10. Commonly known photolithographic masking, etching, doping and oxidation techniques are employed to form in $p^-$ substrate 1 channel stop regions 19 beneath semi-recessed field oxide regions 2 and 3, which field oxide regions were oxidized using a mask patterned to create as shown in FIG. 1 a centrally disposed field oxide region 3 surrounded by an active region 4 and bordering field oxide regions 2. It should be apparent that the field oxide regions 2 and 3 could, with substantially equal effect, be trenches filled with dielectric material.

Figure 6:
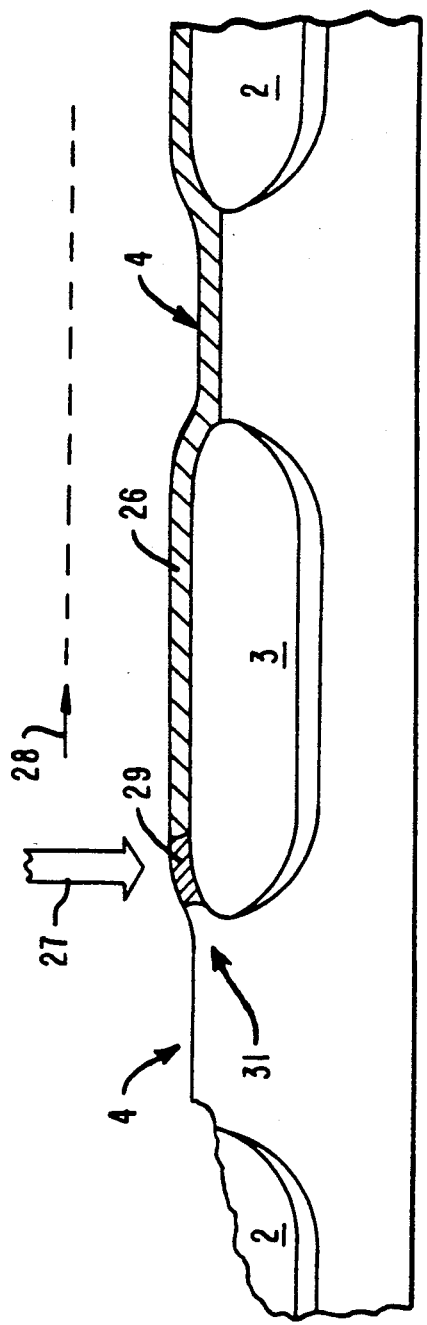
Figure 7:
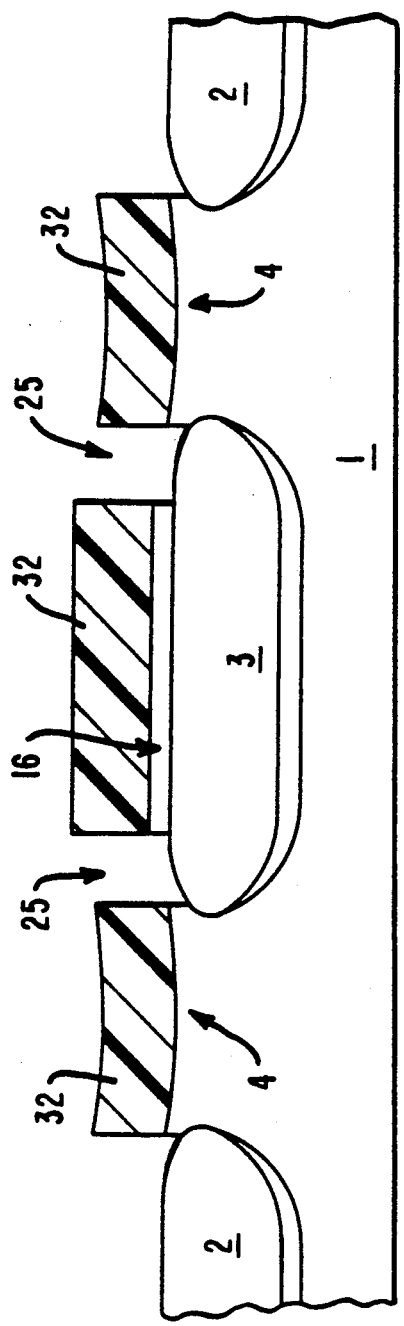

The surface is then covered by a chemical vapor deposited (CVD) layer of polycrystalline or amorphous silicon to a nominal thickness of 500 nanometers, as depicted at 26 in FIG. 6. Seeded recrystallization of layer 26 follows, preferably using a beam of coherent luminous energy, a laser, or a pulsed strip heater, schematically depicted as 27 in FIG. 6. The concentric arrangement of active regions 4 ensure that melted region 29 of polycrystalline or amorphous silicon layered 26 propagates from a monocrystalline silicon seed such as at location 31 when a scanning beam 27 moves onto field oxide region 3, without regard to the direction that scan 28 follows in crossing field oxide region 3. The shape of energy beam 27 is similarly of minor significance in the context of the present arrangement if the successor to scan 28 overlaps the path of melt 29. Further consideration of the pattern in FIG. 1, and the seeded recrystallization described with reference to FIG. 6, also shows that the seed source is actually multi-dimensional. The monocrystalline seed propagates not only from behind the laser scan path, but also from the immediately adjacent and overlapping melt regions recrystallized during preceding scan. Thereby, recrystallization is more efficiently and effectively performed at locations relatively distant from the monocrystalline silicon seed region.

Layer 26 in FIG. 6 is described above as chemical vapor deposited silicon in polycrystalline or amorphous form. It is also possible to form silicon layer 26 in generally epitaxial form from single crystal regions 4. However, since the continuity of the single crystal character across the full expanse of field oxide 3 by epitaxial growth is relatively unlikely, recrystallization is likely to be required to perfect the crystalline character of layer 26 for field effect transistors fabrication.

Following recrystallization, the substrate is photolithographically masked by photoresist pattern 32, and then subjected to a silicon etch operation to remove recrystallized silicon in regions 25, namely, from over field oxide 3 adjacent substrate regions 4. Thereby, recrystallized and dielectrically isolated silicon region 16 remains centered over field oxide region 3.

Figure 8:
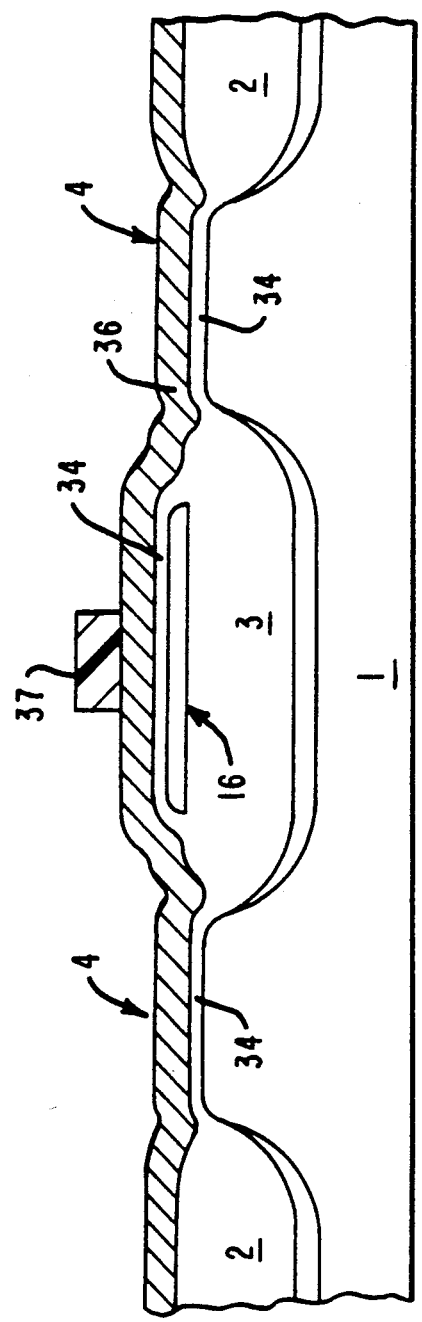
Figure 9:
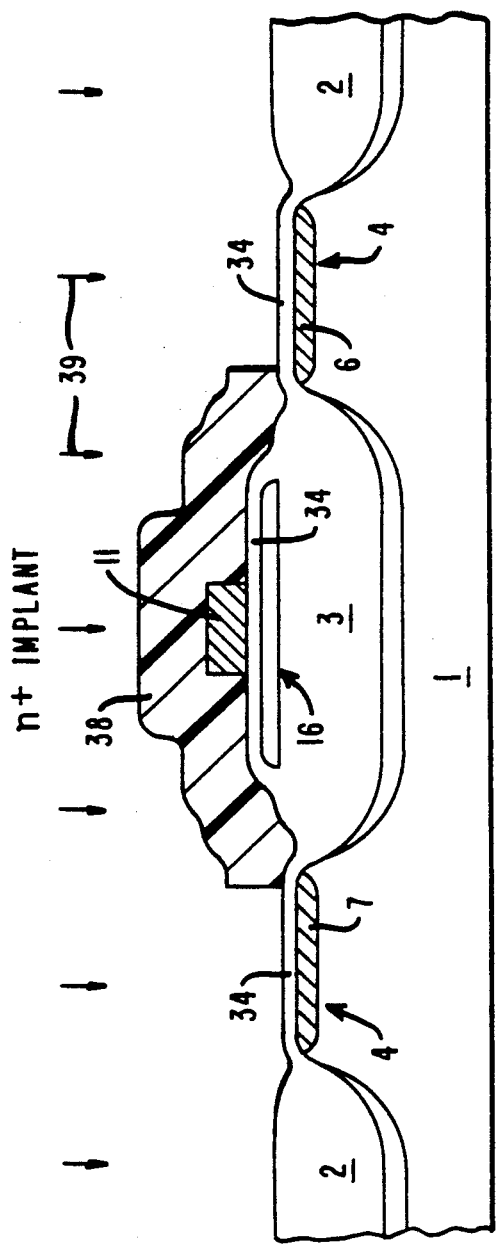

A thermal oxidation step follows, to form a layer of silicon dioxide 34 over active regions 4 and recrystallized silicon 16 as depicted in FIG. 8. Silicon dioxide layer 34 will service as the gate dielectrics for both field effect transistors. Nominally, the oxidation is continued until oxide layer 34 is approximately 40 nanometers thick.

Fabrication thereafter continues with a deposition of another polycrystalline silicon layer, 36, over the substrate structure, which polysilicon 36 is heavily n-type impurity doped either in situ or following deposition. A photoresist mask 37 is then formed in the pattern of the desired gate electrode 11 (FIG. 1), to create following the etching of the polysilicon layer 36 the gate electrode 11 shown in FIG. 9. Referring in the composite FIGS. 1, 3 and 9, note that the embodying electrode 11 extends across both segments of active region 4, as well as across recrystallized silicon region 16.

A photoresist mask 38 is then formed over the general region of field oxide 3, and an n-type ion implant 39 undertaken to selectively form in regions 4 conductive source/drain regions 6 and 7. Self-aligned channels 8 and 9 between source/drain regions 6 and 7, FIG. 1, are formed during ion implant 39 by the implant masking attributable to polysilicon gate electrode 11. The result is an n-channel field effect transistor having an n+ doped source region 7, an n+ doped drain region 6, a pair of functionally parallel n-type channels 8 and 9, and a self-aligned and shared polysilicon gate electrode 11.

Figure 10:
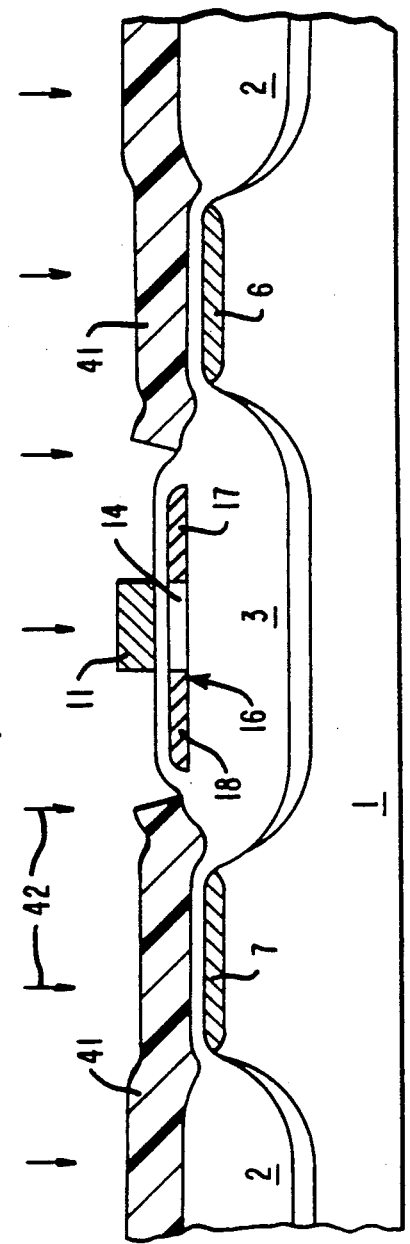

The p-channel device is, according to the present embodiment, formed next in the sequence of fabrication, though it should be apparent that the present sequence of forming the p-channel and n-channel devices is of no significant consequence. As shown in FIG. 10, substrate 1 is covered by a patterned photoresist mask 41, thereby exposing the region generally corresponding to field oxide region 3 to p+ ion implant 42. Implant 42 forms source/drain regions 17/18 in recrystallized silicon 16, which source/drain regions are separated by p-type channel 14 and in self-alignment with polysilicon gate electrode 11. Preferably, polysilicon gate electrode 11 is sufficiently n-type doped to avoid counterdoping during the p+ ion implant 42. Even if counterdoping were to occur, any p-n junction created along gate electrode 11 could be shorted by the formation of a shutting metalization layer, such as might be created by employing commonly practiced selective tungsten deposition.

As fully depicted in the various views of FIG. 1-4, it is evident that the p-channel field effect transistor, composed of p+ source region 18, p+ drain region 17, channel 14 and polysilicon gate electrode 11, is fabricated to provide the quality operational characteristics of monocrystalline silicon devices, while, nevertheless, also providing full electrical isolation by situation upon dielectric region 3.

In the context of the embodiment in FIG. 1, note that the effective channel width of the n-channel field effect transistor, composed of functionally parallel channels 8 and 9, is substantially comparable to that of the p-channel field effect transistor channel 14, providing a balanced output impedance to the inverter/buffer depicted schematically in FIG. 2. The p+ contact patterns 43 and n+ contact patterns 44 are also depicted in FIG. 1, to illustrate one means for interconnecting the various field effect transistors electrodes in the metalization layer to perform circuit functions of the preferred inverter/buffer in FIG. 2.

The claims which follows should be read and interpretation consistent with the fundamental concepts which have for purposes of illustration been embodied in the context of contemporary fabrication technology. Refinements in the practice of the invention, for example involving semiconductor materials other than the silicon, should not be considered meaningful distinctions.

What is claimed is:

1. A process for fabricating an integrated circuit structure having first and second dielectrically separated field effect transistors on a common semiconductor substrate, comprising the steps of:

forming a first field dielectric region in the semiconductor substrate;

forming a layer of polycrystalline or amorphous semiconductor over the first field dielectric region and adjacent semiconductor substrate regions;

melting and cooling the layer of polycrystalline or amorphous semiconductor to recrystallize over the first field dielectric region from seed in adjacent semiconductor substrate regions;

patterning the recrystallized semiconductor layer to retain an active region over the first field dielectric region; and forming a gate electrode over the recrystallized semiconductor layer and adjacent semiconductor substrate regions to define aligned channels and source/drain regions.

2. The process recited in claim 1, wherein the layer of polycrystalline or amorphous semiconductors over the first dielectric region is formed to extend over any concentrically disposed region of the adjacent semiconductor substrate regions.

3. The process recited in claim 2, wherein the melting of the layer of polycrystalline or amorphous semiconductor is performed by a beam of coherent luminous energy which scans the layer from a location on the adjacent semiconductor substrate region to a location on the first field dielectric layer and back to a location on the adjacent semiconductor substrate region.

4. The process recited in claim 3, wherein the semiconductor substrate is monocrystalline silicon, the layer of recrystallized semiconductor is formed from silicon, and the patterning of the recrystallized semiconductor layer is comprised of photolithographic masking and etching operations to retain a dielectrically isolated active region of the layer over the first field dielectric region.

5. The process recited in claim 4, wherein the forming of the gate electrode is comprised of:

forming a gate dielectric over the recrystallized silicon and the adjacent silicon substrate regions;

depositing and patterning a gate electrode layer of polycrystalline silicon to extend over the recrystallized silicon and the adjacent silicon substrate regions; and doping the recrystallized silicon and the adjacent silicon substrate regions in the presence of the polycrystalline silicon gate electrode to form channels in the silicon under the gate electrode and source/drain regions either side thereof.

* * * * *